(12) United States Patent
Miura et al.

(10) Patent No.: US 8,975,533 B2
(45) Date of Patent: Mar. 10, 2015

(54) PRINTED WIRING BOARD, METHOD OF SOLDERING QUAD FLAT PACKAGE IC, AND AIR CONDITIONER

(75) Inventors: Tsuyoshi Miura, Tokyo (JP); Kazuo Namikoshi, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 707 days.

(21) Appl. No.: 13/272,663

(22) Filed: Oct. 13, 2011

(65) Prior Publication Data
US 2012/0181069 A1    Jul. 19, 2012

(30) Foreign Application Priority Data

Jan. 14, 2011   (JP) ................... 2011-006339

(51) Int. Cl.
*H05K 1/09*    (2006.01)
*H05K 1/16*    (2006.01)
(Continued)

(52) U.S. Cl.
CPC ............ *H05K 3/3468* (2013.01); *B23K 1/0016* (2013.01); *B23K 1/085* (2013.01); *B23K 1/203* (2013.01); *B23K 2201/42* (2013.01); *H05K 1/111* (2013.01); *H05K 3/3421* (2013.01);
(Continued)

(58) Field of Classification Search
CPC ... H05K 1/111; H05K 3/3421; H05K 3/3484; H05K 1/116; H05K 3/34; H05K 3/3447; H05K 3/3468; H05K 2203/046; H05K 2203/048
USPC ...................... 174/257, 260; 228/125; 29/843
See application file for complete search history.

(56) References Cited

U.S. PATENT DOCUMENTS 5,604,333 A    2/1997   Kennish et al.
5,877,033 A *  3/1999   Matern ........................ 438/14
(Continued)

FOREIGN PATENT DOCUMENTS

EP    1 383 365 A1    1/2004
EP    1 753 276 A1    2/2007
(Continued)

OTHER PUBLICATIONS

Machine Translation of Nippon (JP 2000-040869) provided with Office Action.*

(Continued)

*Primary Examiner* — Chau N Nguyen
*Assistant Examiner* — Roshn Varghese
(74) *Attorney, Agent, or Firm* — Buchanan Ingersoll & Rooney PC

(57) ABSTRACT

A printed wiring board has a solder-land group for placing a quad flat package IC, and the solder-land group consists of front solder-land groups and rear solder-land groups. The printed wiring board includes rear solder-drawing lands that are positioned adjacent to rear solder-land groups, that have front edges each of which is substantially parallel to a longitudinal direction of rear solder lands constituting the rear solder-land group and has a length approximately equal to or longer than that of the solder lands in the longitudinal direction, that are separated into two parts in a horizontal direction with respect to a traveling direction of solder flow such that a gap between the respective two separate lands is made wider in its rearward portion than that in its frontward portion, and that have a slit substantially parallel to the longitudinal direction near the front edge.

12 Claims, 4 Drawing Sheets

(51) Int. Cl.
  *B23K 31/00* (2006.01)
  *H05K 3/34* (2006.01)
  *B23K 1/00* (2006.01)
  *B23K 1/08* (2006.01)
  *B23K 1/20* (2006.01)
  *H05K 1/11* (2006.01)

(52) U.S. Cl.
  CPC .. *H05K2201/094* (2013.01); *H05K 2201/0969* (2013.01); *H05K 2201/09781* (2013.01); *H05K 2201/10689* (2013.01); *H05K 2203/046* (2013.01)
  USPC ............................ 174/260; 174/257; 228/125

(56) References Cited

U.S. PATENT DOCUMENTS

| | | | |
|---|---|---|---|
| 6,998,861 B2* | 2/2006 | Nakai et al. | 361/767 |
| 7,000,312 B2* | 2/2006 | Fukunabe et al. | 174/260 |
| 7,405,945 B2 | 7/2008 | Miura | |
| 2007/0034403 A1* | 2/2007 | Miura | 174/260 |
| 2007/0175659 A1 | 8/2007 | Torii | |
| 2010/0193233 A1 | 8/2010 | Miura | |

FOREIGN PATENT DOCUMENTS

| | | |
|---|---|---|
| EP | 1542517 B1 | 7/2007 |
| JP | 05-315733 A | 11/1993 |
| JP | 08-250844 A | 9/1996 |
| JP | 11-251725 A | 9/1999 |
| JP | 2000-40869 A | 2/2000 |
| JP | 2001-352159 A | 12/2001 |
| JP | 2005-175186 A | 6/2005 |
| JP | 2007-48874 A | 2/2007 |
| JP | 2009-004689 A | 1/2009 |
| JP | 2010-177502 A | 8/2010 |

OTHER PUBLICATIONS

The extended European Search Report dated Jul. 20, 2012, issued in corresponding European Patent Application No. 11008197.3. (4 pages).

Office Action issued on Jan. 23, 2014, by the Chinese Patent Office in corresponding Chinese Patent Application No. 201110377204.3 and an English translation of the Office Action. (13 pages).

* cited by examiner

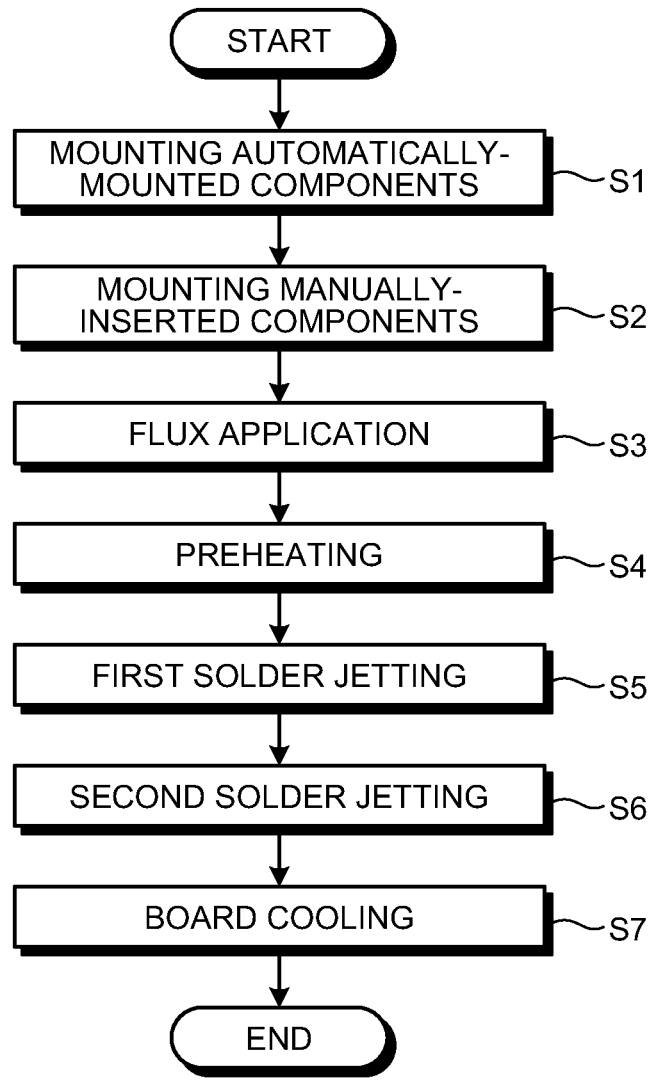

PRINTED WIRING BOARD, METHOD OF SOLDERING QUAD FLAT PACKAGE IC, AND AIR CONDITIONER

BACKGROUND OF THE INVENTION

1. Field of the Invention

The present invention relates to a printed wiring board on which a quad flat package integrate circuit (IC) is mounted by soldering using a jet solder bath.

2. Description of the Related Art

Generally, printed wiring boards are increasingly required to be assembled at a high component-mounting package density, and therefore, narrow-pitch quad flat package ICs and the like have to be mounted on a board. On the other hand, ecologically friendly lead-free solder is rapidly proceeding to practical use. However, the lead-free solder has poor solderability compared to lead-containing eutectic solder that has conventionally been used. For that reason, a short circuit due to the solder may occur between lead terminals of a quad flat package IC and the like.

Conventionally, as this type of printed wiring board, there has been a printed wiring board in which an eyelet is provided on one of the spaces between a forward soldering land group and a rearward soldering land group, and grid-formed solder-drawing lands are provided on the other of the spaces between the forward soldering land group and the rearward soldering land group and in the tail-endmost portion of the rearward soldering land group to prevent solder bridges from being formed (for example, Japanese Patent Application Laid-open No. 2005-175186, PP. 1 to 3, FIGS. 1 to 11).

Moreover, one in which a solder drawing land is provided at a point where a front soldering land group and a rear soldering land group that is adjacent to the front soldering land group are adjacent to each other, and/or in a trailing area of the rear soldering land group, and the solder drawing land is formed with a slit substantially parallel to the lines of soldering lands of the front soldering land group or rear soldering land group that are adjacent to a front part of the solder drawing land has been available (for example, Japanese Patent Application Laid-open No. 2007-48874, PP. 1 to 4, FIGS. 1 to 4).

Furthermore, one in which a solder drawing land is provided at a point where a frontward soldering land group and a rearward soldering land group that is adjacent to the frontward soldering land group are adjacent to each other, and/or in a trailing area of the rearward soldering land group, the solder drawing land has first and second rearward solder drawing lands, the second rearward solder drawing land being formed larger than the first rearward solder drawing land and at least having its part formed rearward with respect to the direction of travel in soldering of the first rearward solder drawing land has been available (for example, Japanese Patent Application Laid-open No. 2000-40869, P. 5, FIGS. 1 to 2).

For the conventional printed wiring boards described above, elaborate management of a manufacturing process is required to maintain stable and high quality soldering that does not cause any solder bridges between leads of a quad flat package IC, and there has been a problem that it is difficult to maintain higher precision as the lead pitch is narrowed or when lead-free solder having poor solderability is used.

SUMMARY OF THE INVENTION

It is an object of the present invention to at least partially solve the problems in the conventional techniques.

In order to solve the above-mentioned problems and achieve the object, one aspect of the present invention is characterized in that a printed wiring board that has a solder land group used for placing a quad flat package integrated circuit (IC), the solder land group including front solder-land groups and rear solder-land groups, comprising: rear solder-drawing lands that are positioned adjacent to the rear solder-land groups, that have front edges each of which is substantially parallel to a longitudinal direction of solder lands constituting the rear solder-land group and has a length approximately equal to or longer than that of the solder lands in the longitudinal direction, that are separated into two parts in a horizontal direction with respect to a traveling direction of solder flow such that a gap between the respective separate lands is made wider in its rearward portion than that in its frontward portion positioned forward in the traveling direction, and that have a slit substantially parallel to the longitudinal direction near the front edge.

Another aspect of the present invention provides a method of soldering a quad flat package IC to a printed wiring board that has a solder-land group for placing a quad flat package IC, the solder-land group consisting of front solder-land groups and rear solder-land groups, the printed wiring board comprising rear solder-drawing lands that are positioned adjacent to the rear solder-land groups, that have front edges each of which is substantially parallel to a longitudinal direction of solder lands constituting the rear solder-land group and has a length approximately equal to or longer than that of the solder lands in the longitudinal direction, that are separated into two parts in a horizontal direction with respect to a traveling direction of solder flow such that a gap between the respective separate lands is made wider in its rearward portion than that in its frontward portion in the traveling direction, and that have a slit substantially parallel to the longitudinal direction near the front edge, the method comprising: a mounting step of mounting a quad flat package IC to the printed wiring board; a flux application step of applying flux activator to the printed wiring board on which the quad flat package IC has been mounted; a preheat step of heating the flux activator that has applied to the printed wiring board to an activation temperature; a primary solder jetting step of soldering lead portions of the quad flat package IC on the printed wiring board by a jet soldering equipment; and a secondary solder jetting step of removing the solder that has bridged between leads of the quad flat package IC in the primary solder jetting step, by the rear solder-drawing land having the slit.

The other aspect of the present invention provides an air conditioner, wherein an electric parts box in which a printed wiring board is housed is placed above a compressor in a compressor chamber, the printed wiring board having a solder land group used for placing a quad flat package integrated circuit (IC), the solder land group including front solder-land groups and rear solder-land groups, wherein the printed wiring board comprises rear solder-drawing lands that are positioned adjacent to the rear solder-land groups, that have front edges each of which is substantially parallel to a longitudinal direction of solder lands constituting the rear solder-land group and has a length approximately equal to or longer than that of the solder lands in the longitudinal direction, that are separated into two parts in a horizontal direction with respect to a traveling direction of solder flow such that a gap between the respective separate lands is made wider in its rearward portion than that in its frontward portion positioned forward in the traveling direction, and that have a slit substantially parallel to the longitudinal direction near the front edge.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is a flowchart of a jet soldering process for a quad flat package IC.

DETAILED DESCRIPTION OF THE PREFERRED EMBODIMENTS

Embodiments of a printed wiring board, a method of soldering a quad flat package IC, and an air conditioner according to the present invention are described in more detail with reference to the drawings below. It is noted that the present invention is not limited to these embodiments.

Embodiments

Explanation of Configuration

Figure 1:
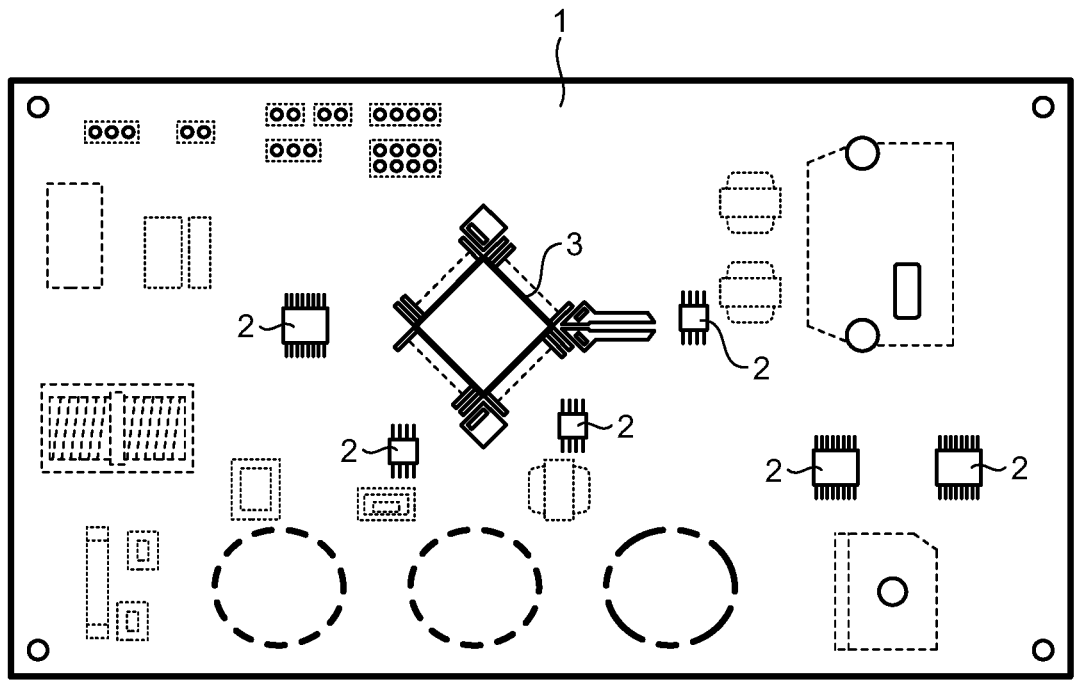
FIG. 1 is a plan view showing a schematic layout of a printed wiring board according to the present invention when viewed from a rear side thereof.
Figure 2:
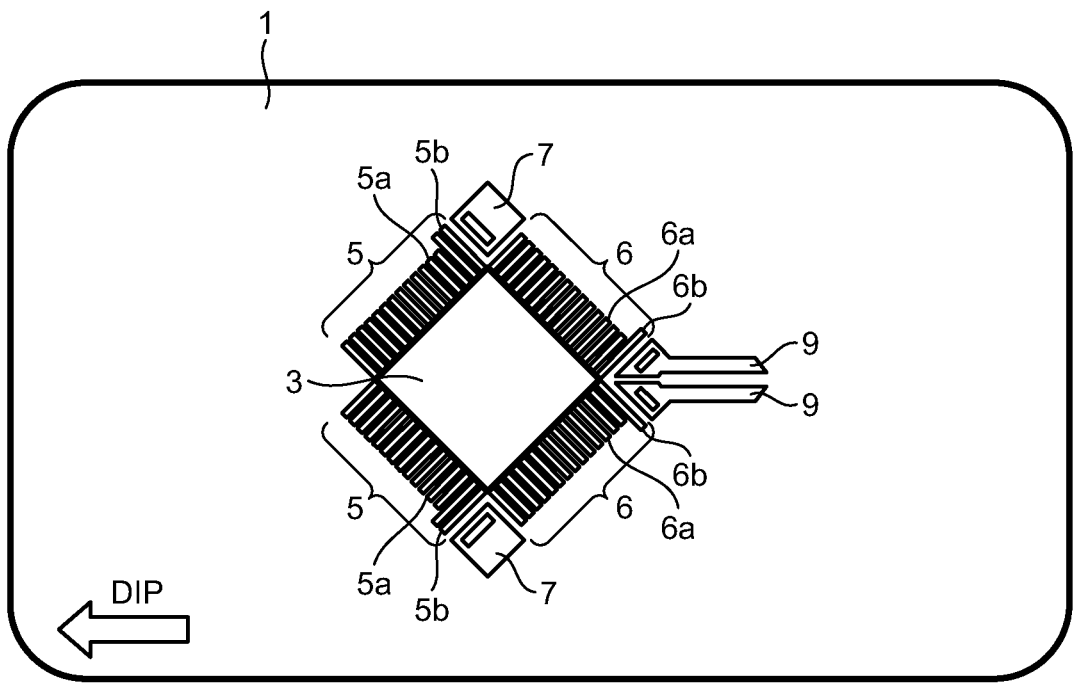
FIG. 2 is a plan view showing an essential part of the printed wiring board.
Figure 3:
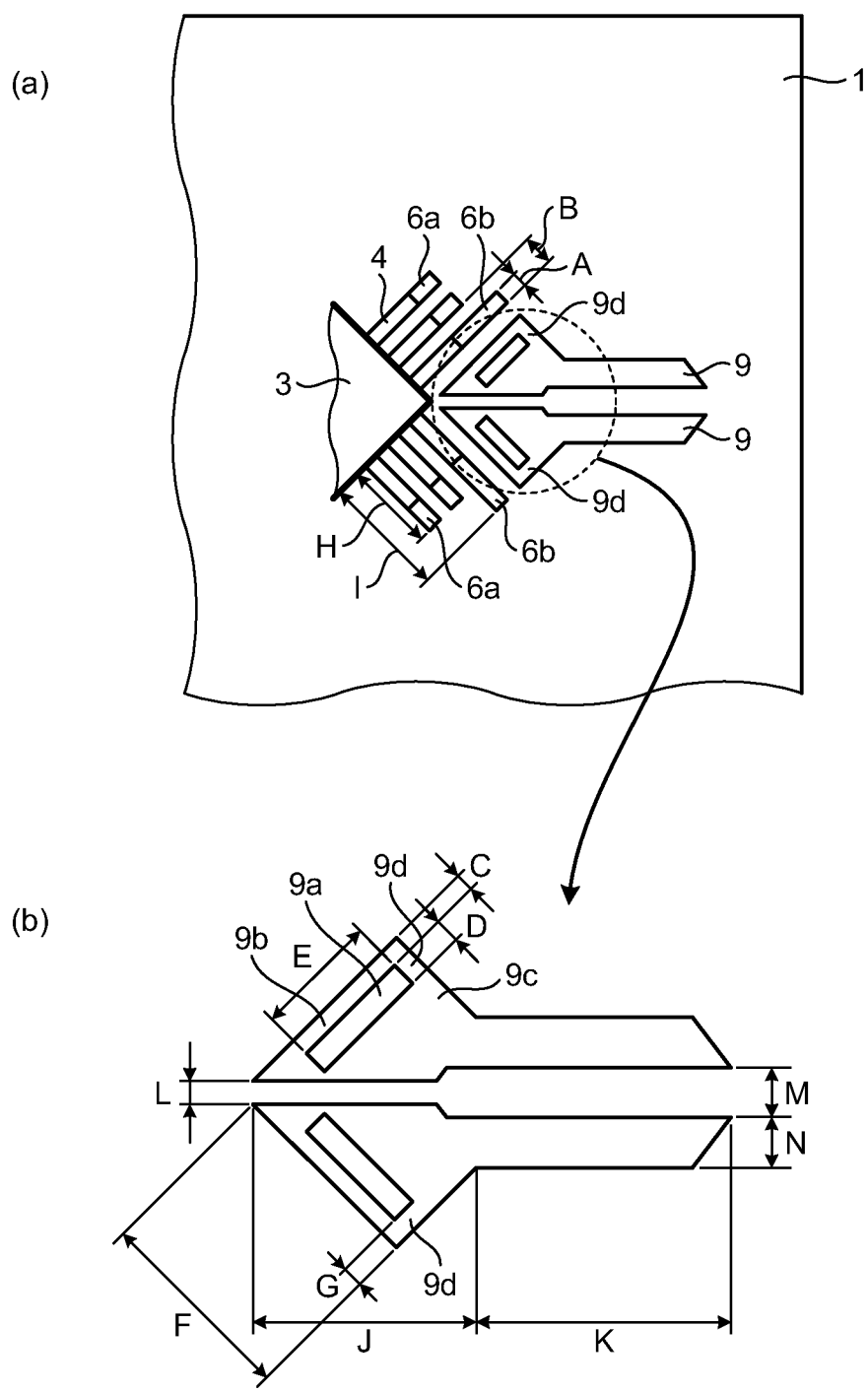
FIG. 3 is a view showing a rear end part of a rear solder-land group of the printed wiring board.

Firstly, a configuration of a printed wiring board according to the present embodiment (a printed wiring board on which a quad flat package IC is mounted) is described using FIGS. 1 to 3. FIG. 1 is a plan view showing a schematic layout of the printed wiring board according to the present embodiment when viewed from a rear side thereof. FIG. 2 is a plan view showing an essential part of the printed wiring board shown in FIG. 1, in which a state in which components have been mounted is illustrated. Specifically, it is a plan view of the essential part, showing the quad flat package IC and surroundings thereof. FIG. 3 is a view showing a rear end part of a rear solder-land group that constitutes solder lands on which the quad flat package IC is mounted in the printed wiring board according to the present embodiment. FIG. 3(a) is an enlarged plan view of the essential part in a state in which the quad flat package IC is mounted, and FIG. 3(b) is an enlarged plan view for explaining a rear solder-drawing land.

On a printed wiring board 1 shown in the figures, components (for example, a chip resistor, a chip capacitor, a chip diode, a discrete resistor, a discrete capacitor, a discrete diode, etc.) (none is shown) that are automatically mounted on a front surface thereof and components (for example, a high-current resistor, a hybrid IC, a transformer, a coil, a large-capacity semiconductor, a large-volume capacitor, etc.) (none is shown) that are manually inserted therein are placed.

Further, on a rear surface of the printed wiring board 1, a copper foil (not shown) is provided, and a small outline package (SOP) IC 2 automatically mounted is provided in such a manner that this rear surface is maintained in a plane state as much as possible, while a quad flat package IC 3 is mounted and arranged by an automatic mounting machine (not shown) with inclination of 45° with respect to the direction indicated by an arrow shown in FIG. 2, that is the direction of travel in jet soldering (DIP direction) such that one corner thereof is positioned at the front and the other corner opposed thereto is positioned at the end.

For this quad flat package IC 3, as shown in FIG. 2, front solder-land groups 5 that are provided to the right and left and form a front corner and rear solder-land groups 6 that form a rear corner, each formed to be associated with leads, are provided on the printed wiring board 1. In a rear part of the front solder-land group 5, there is provided a front-solder-land-group rear land 5b that is a rear solder land formed longer than front solder lands 5a that are rest of the solder lands positioned at a front part thereof. Similarly, in a rear part of the rear solder-land group 6, there is provided a rear-solder-land-group rear land 6b that is a rear solder land formed longer than rear solder lands 6a that are rest of the solder lands positioned at a front part thereof. Although FIG. 2 shows an example that a single land at the rear end of the rear solder-land group 6 serves as the rear-solder-land-group rear land 6b, two or more lands from the rear end may be made to serve as the rear-solder-land-group rear land 6b. Similarly for the front-solder-land-group rear land 5b described above, a single land or two or more lands at the rear end of the front solder-land group 5 may be made to serve as the front-solder-land-group rear land 5b. In addition, a side solder-drawing land 7 is provided between the front solder-land group 5 and the rear solder-land group 6. In the present embodiment, "frontward" indicates a direction of travel in jet soldering (direction of DIP), and "rearward" indicates a direction opposite to the direction of travel in jet soldering. Moreover, "right/left" indicates a direction with respect to the direction of travel in jet soldering. For example, in FIGS. 1 to 3, the top side of the sheet corresponds to "right" and the bottom side of the sheet corresponds to "left".

Furthermore, in the rear side of the rear solder-land groups 6 (see FIG. 2) on right and left that form the rear end corner, as shown in FIG. 3(a), rear solder-drawing lands 9 are provided that have slits 9a parallel to the respective right and left rear solder-land groups 6 (that is, parallel to a longitudinal direction of the rear solder lands 6a), that are separated to the right and left into two parts (separated into two parts in a horizontal direction with respect to the direction of travel in jet soldering), and that are formed such that a gap between the right and left, two separate parts is made narrower in a front portion thereof and wider in a rear portion thereof. Front ends (linear portions adjacent to the rear solder-land groups 6 positioned on the right and left) of the rear solder-drawing lands 9 are formed to be parallel (substantially parallel) to the adjacent rear solder-land groups 6.

A main feature of the printed wiring board 1 according to the present embodiment is that the rear solder-drawing land 9 is formed in a different shape from a conventional one. Specifically, as shown in FIGS. 2 to 3, the rear solder-drawing land 9 on the printed wiring board 1 has the slit 9a formed to be long in the same direction as the direction of length of the respective rear solder lands 6a of the respective rear solder-land groups 6 that are positioned adjacent to the rear solder-drawing land 9 in the frontward direction and to be substantially parallel to the rear solder land 6a, has 2-divisional part to the right or left, and is formed such that the gap between the right and left 2-divisional rear solder-drawing lands 9 is made narrower in the front portion and wider in the rear portion.

Next, one example of dimensions and the like of the rear solder-drawing land 9 and the like is described. For example, as shown in FIG. 3, a width A of each lead 4 of the quad flat package IC 3 is 0.35 millimeters (mm), and a pitch B of the leads 4 is 0.65 mm. Note that the width and pitch of the front solder lands 5a and the rear solder lands 6a are made substantially equal to the width A and pitch B of the leads 4 so that soldering is facilitated.

As shown in FIG. 3 and the like, the rear solder-drawing lands 9 formed of copper foil are separated into the right and left parts, and these lands on the right and left are line symmetric (mirror symmetric) to each other. As for the dimensions of these lands, a copper foil width F of a land head portion (front end) of the rear solder-drawing land adjacent to the rear solder-land group 6 is set to 4.3 mm. Moreover, a dimension for a position C of the slit 9a without copper foil is set to 0.4 mm. That is, the slits 9a are arranged at 0.4 mm points from the front ends of the rear solder-drawing land 9 so as to oppose to the respective adjacent rear solder-land groups 6. In addition, on both end sides in the direction of length of the slit 9a, copper foil remainders that are copper foil joint portions 9d connecting a front portion 9b to a rear portion 9c of the rear solder-drawing land 9 relative to the slit 9a are formed. The joint portions 9d are formed in a direction perpendicular to the direction of alignment of the rear solder lands 6a (direction of length), in other words, at both right and left ends of the rear solder-drawing land 9. A width G of one of the joint portions 9d that is formed in a rearward position with respect to the direction of travel in jet soldering is set to 0.5 mm. Further, a width D of the slit 9a is set to 0.7 mm. As for the length of the rear solder-drawing land 9, a length J of a solder draw-in portion that is a head portion thereof is set to 3.6 mm, and a length K of a releasing portion that is a rear portion thereof is set to 5.8 mm. For the gap between the right and left rear solder-drawing lands 9, a gap L between the draw-in portions forming the head is set to 0.5 mm, and a gap M between the releasing portions forming the rear is set to 1.0 mm.

In this example, the slits 9a are formed in the same 0.4 mm points (dimension C) from respective front sides of the rear solder-drawing lands 9 corresponding to the respective right and left rear solder-land groups 6 that are adjacent to the rear solder-drawing lands 9, leaving thin portions of copper foil in the direction perpendicular to the direction of alignment of the rear solder lands 6a adjacent to the slits 9a, in other words, at the both end sides of the rear solder-drawing lands 9. By providing the slits 9a, an area of the front portion 9b (the frontward portion relative to the slit 9a) of the rear solder-drawing land 9 is made small and an area of the rear portion 9c (the rearward portion relative to the slit 9a) is made larger than the area of the front portion 9b, so that drawing solder from the front portion 9b to the rear portion 9c can be facilitated and reverse of solder from the rear portion 9c to the front portion 9b can be suppressed. That is, in the present embodiment, the rear solder-drawing land 9 is formed so as to facilitate drawing solder from the rear solder-land groups 6 adjacent thereto to the rear solder-drawing land 9, and to prevent reverse of solder from the rear solder-drawing land 9 to the rear solder-land groups 6 and generation of solder waste. Moreover, the rear solder-drawing lands 9 are separated to the right and left so as to prevent reverse of solder back to a side of the rear solder-land groups 6 caused by collision of solder flowing from the right and left rear solder-land groups 6 at the end on a side of the quad flat package IC 3, and the area of the head portion of the rear solder-drawing land 9 is made large. Furthermore, the gap between the head portions of the right and left rear solder-drawing lands 9 is set to be narrower to increase a solder drawing force, while the gap between the releasing portions in the rear thereof is set to be wider to decrease a solder reversing force from the rear portions 9c to the front portions 9b, thereby preventing any solder bridges from being caused in the rear of the rear solder-land groups 6.

Moreover, a length I of the rear-solder-land-group rear land 6b is longer than a length H of the other solder lands 6a as shown in FIG. 3. That is, the dimension I of the rear land 6b of the rear solder-land group 6 is made to be longer than the dimension H of the solder lands 6a positioned on the front side. For example, the dimensions are 3.5 mm≤H<I≤4.3 mm. In this example, the dimension I of the rear land 6b is made equal to or larger than an outline dimension F (4.3 mm) of a front side (one side adjacent to the rear solder-land group 6) of the rear solder-drawing land 9, which is a dimension of the length of the front portion 9b of the adjacent rear solder-drawing land 9, such that the length F of an adjacent portion by which solder is drawn from a side of the rear solder-land group 6 to the rear solder-drawing land 9 is made to be equal to or longer than the dimension I (I≤F) to facilitate drawing solder into a side of the rear solder-drawing land 9. In the example shown in FIG. 3, the dimension H of the solder lands 6a is equal to or larger than the length (3.5 mm) of a portion on which the lead 4 is soldered.

Explanation of Soldering Method

Next, a method of soldering the quad flat package IC 3 onto the printed wiring board 1 is described. FIG. 4 is a flowchart of a jet soldering process for the quad flat package IC according to the present embodiment. With reference to FIG. 4, the process of soldering the quad flat package IC 3 onto the printed wiring board 1 using a jet solder bath (not shown) is described.

When the quad flat package IC 3 is soldered to the printed wiring board 1, automatically-mounted components (for example, a chip resistor, a chip capacitor, a chip diode, a discrete resistor, a discrete capacitor, a discrete diode, etc.) (not shown) and the quad flat package IC 3 are mounted on front surface and rear surface of the printed wiring board 1 by an automatic mounting machine at first (step S1). Next, manually-inserted components (for example, a high-current resistor, a hybrid IC, a transformer, a coil, a large-capacity semiconductor element, a large-capacitance capacitor, etc.) are manually inserted therein and mounted thereon (step S2). Subsequently, in a flux application process of a step S3, a flux activator that makes solder fit the copper foil is applied to the rear surface of the printed wiring board 1 on which the automatically mounted components and the manually inserted components have been mounted (step S3). Preheating to heat the flux applied at the step S3 is then performed to have the best activating temperature (step S4).

Thereafter, soldering is performed by injecting a jet of solder uniformly to lead portions of the components from a solder jetting means (not shown) that jets solder out from a nozzle having many holes in such a manner as a jet of water in a fountain to the rear surface of the printed wiring board 1 (step S5). Because there are points where solder bridges are generated between leads of the components in a state just after a first solder jetting process of the step S5 is performed, the printed wiring board 1 is then passed on a surface of the liquid in a solder bath having a flat solder liquid surface in the direction indicated by the arrow shown in FIG. 2 (direction of DIP) to remove solder bridging between leads such as the leads 4 of the quad flat package IC 3, thereby resolving the solder bridges (step S6). Finally, the printed wiring board 1 on which the various kinds of components are soldered is cooled (step S7), and the operation of soldering various kinds of components including the quad flat package IC 3 onto the printed wiring board 1 is completed.

Details of Operation in Soldering Quad Flat Package IC 3

Next, soldering of the quad flat package IC 3 onto the printed wiring board 1 is described in further detail. When the mounted quad flat package IC 3 enters a solder jetting part of the jet solder bath in the first solder jetting process of the step S5 described above, the solder flows rearward along the solder leads 4 on the front side corresponding to the front solder-land groups 5 on both the right and left sides of the quad flat package IC 3, namely, the both right and left solder lands 5*a* on the side. At this time, by the action of surface and interfacial tensions of the front solder lands 5*a* of the front solder-land groups 5 and each of the leads 4 of the quad flat package IC 3, the solder moves rearward while generating bridges one after another. The solder that has moved to a rear side of the front solder-land groups 5 is drawn into the side solder-drawing land 7 (see FIG. 2) adjacent thereto.

Moreover, similarly in the rear solder-land groups 6, the solder flows rearward along the solder leads 4 on the rear side corresponding to the rear solder-land groups 6 on both the right and left sides of the quad flat package IC 3, namely, the both right and left solder lands 6*a* on the rear side. At this time, by the action of surface and interfacial tensions on the rear solder lands 6*a* of the rear solder-land groups 6 and each of the leads 4 of the quad flat package IC 3, the solder moves rearward while generating bridges one after another. The solder that has moved to a rear of the rear solder-land groups 6 is drawn into the trailing, rear solder-drawing lands 9 (see FIG. 2) adjacent thereto.

In this way, by forming the rear solder-drawing land 9, the solder is drawn into the rear solder-drawing land 9 from the rear side of the rear solder-land groups 6 at the time of soldering (first solder jetting process), and in this situation a force of reversing the solder from the rear solder-drawing lands 9 toward a side of the adjacent rear solder-land groups 6, respectively, is exerted on the solder that has been drawn onto the rear solder-drawing lands 9 by surface and interfacial tension effects of the solder.

In the rear solder-drawing land 9 proposed in the present embodiment, arrangement of the slits 9*a* that are substantially parallel to the alignment of the rear solder lands 6*a* of the rear solder-land groups 6 facilitates drawing the solder into the rear solder-drawing lands 9, and in addition, enables dispersion of the surface and interfacial tensions of the solder that has once been drawn onto the rear solder-drawing land 9, thereby reducing the reversing force toward the rear solder-land groups 6 adjacent frontward. Furthermore, the rear solder-drawing lands 9 are separated to the right and left into two parts, and are arranged such that the gap between the right and left separate rear solder-drawing lands 9 is made narrower in the front portion thereof and wider in the rear portion thereof, thereby increasing the force of drawing the solder that flows therein from the rear solder-land groups 6, and releasing the solder rearward while preventing collision of the solder that has been drawn into the right and left rear solder-drawing lands 9. As a result, solder bridges in the rear solder-land groups 6 are significantly decreased. The inventors have verified and confirmed that when the rear solder-drawing land 9 is formed flat without the slits 9*a* or in a grid shape as in the conventional technique, or when it is formed in one unit without separation of a rear solder-drawing land, or even in the case of separation, when the gap between the right and left rear solder-drawing lands is made uniform in the front portion and rear portion thereof, the number of solder shorts (bridges) and/or the amount of solder waste resulting from bubbles caused in soldering in the rear solder-land groups 6 is much greater than in the printed wiring board 1 of present embodiment, in the case where a quad flat package IC whose leads 4 have narrow interval is used, or in the case where lead-free solder having high surface and interfacial tensions is used.

Moreover, in the rear solder-drawing land 9, the slit 9*a* is positioned such that a solder drawing land part corresponding to the front portion 9*b* positioned frontward relative to the slit 9*a* is smaller (having a smaller area), and a solder drawing land part corresponding to the rear portion 9*c* positioned rearward relative to the slit 9*a* is larger (having a larger area) than the front portion 9*b*, and a joint portions 9*d* are provided so as to leave narrow copper foil on both end sides of the smaller-area solder-drawing land part of the front portion 9*b* and a larger-area solder-drawing land part of the rear portion 9*c* to connect the parts. It has been confirmed that such arrangement enables to adjust and restrain, by the joint portions 9*d* of the narrow copper foil left on the both end sides, the solder reversing force toward the rear solder-land groups 6 frontward adjacent thereto, generated by the surface and interfacial tensions of the solder that has been once drawn onto the rear solder-drawing land 9, and it is possible to disperse the solder by virtue of the slits 9*a* to prevent generation of the bubbles, so that generation of solder waste due to the bubbles after soldering can be reduced. As a result, a manual repairing operation process to remove the solder waste in the later process can be omitted, and omission of a manufacturing process can be achieved.

Furthermore, the rear solder-drawing lands 9 are separated to the right and left into two parts, and are configured such that the gap between the right and left two parts is made narrower in the front portion thereof and wider in the rear portion thereof, thereby increasing the force of drawing solder that flows therein from the rear solder-land groups 6, and releasing the solder rearward while preventing collision of the solder flows that have been drawn into the right and left rear solder-drawing lands 9. It has been verified and confirmed that, as a result, solder bridges in the rear solder-land groups 6 can be significantly reduced.

Moreover, it could be proved that by forming the rear land 6*b* of the rear solder-land group 6 of the quad flat package IC 3 longer than the respective other rear solder lands 6*a*, the solder drawing force is increased, and the effect of reducing solder shorts is increased.

Solder Drawing Action of Rear Solder-Drawing Land 9

Next, the solder drawing action of the rear solder-drawing land 9 is described. The rear solder-drawing land 9 is structured to serve as one of two, right and left separate parts corresponding to the respective right and left rear solder-land groups 6, as already described. This eliminates collision of the solder flowing in from the respective right and left rear solder-land groups 6 in the rear solder-drawing lands 9. Further, by making the gap between the right and left rear solder-drawing lands 9 to be narrower in the front portion thereof and wider in the rear portion thereof, the area of the head portion of the rear solder-drawing land 9 adjacent to the rear solder-land groups 6 is made as large as possible to increase the force of drawing the solder flowing from the rear solder-land groups 6, and to reduce the collision force of the solder after the solder is drawn therein. In addition, the flow of solder to be released rearward is smoothed. Furthermore, because the slits 9*a* that are substantially parallel to the alignment of the rear solder lands 6*a*, the smaller-area front portions 9*b*, the larger-area rear portions 9*c*, and the narrow copper foil joint portions 9*d* on both end sides of the slit 9*a* are provided, solder is smoothly drawn into the rear portions 9*c* from the front portions 9*b*. As a result, solder is drawn into the rear solder-drawing land 9 from the rear solder-land groups 6 smoothly.

Moreover, as described above, although reverse of solder from the rear portions 9c to the front portions 9b is restrained, the solder that flows back to the front portions 9b because the reverse force can not be suppressed completely can be smoothly back to the front portions 9b through the joint portions 9d on both end sides of the slits 9a, thereby making it possible to avoid such defects as generation of solder shorts in the rear solder-land groups 6 caused by collision of the reversed solder and generation of a lot of solder waste can be prevented.

Note that if the ratio between the length (J) of the head portion and the length (K) of the rear portion in the rear solder-drawing land 9 is about 4:6, adequate effect can be obtained. Moreover, as for the degree of precision in arrangement of the slits 9a to be parallel to the alignment of the solder lands 6a of the adjacent rear solder-land group 6 positioned frontward thereof, the higher the precision is, the better the effect is; however, as long as the slits are arranged substantially parallel thereto, certain effect can be obtained, and if they are arranged substantially parallel thereto, for example, within an error range of about 10 degrees, then the adequate effect can be obtained.

As described above, according to the printed wiring board 1 of the present embodiment, such effects can be obtained that solder shorts that are generated when solder travels rearward while forming bridges due to surface and interfacial tensions thereof when the quad flat package IC 3 is soldered using a jet solder bath and solder waste generated by bubbles caused in soldering can be eliminated more certainly, and that points at which a solder short is generated can be reduced.

Note that the various kinds of dimensions, namely, the length J of the head portions of the right and left rear solder-drawing lands 9, the length K of the rear portions thereof, a front gap L and a rear gap M of the right and left rear solder-drawing land, and the dimensions, shapes, and the like of the slit 9a, the front portion 9b, the rear portion 9c, and the joint portion 9d, which are exemplified in the present embodiment, are intended to show one example, but the present invention is not limited thereto, and they can be modified appropriately within a scope in which a certain effect can be obtained, according to the size of the quad flat package IC 3 or conditions or the like of other components and the like. Furthermore, in the above description, the example in which the rear solder-drawing lands 9 having the slits 9a are provided on the right and left sides, respectively, has been described. However, even if only one of the rear solder-drawing lands 9 is provided with the rear solder-drawing land 9 having the slit 9a, an effect similar to the above can be obtained for a part of the rear solder-drawing land 9 having the slit 9a.

Use Example of Printed Wiring Board 1

Figure 5A:
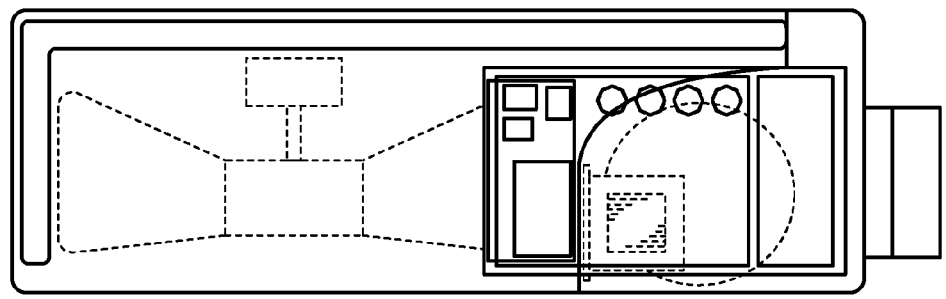
FIGS. 5A and 5B are views showing an example of an air conditioner in which the printed wiring board is disposed.
Figure 5B:
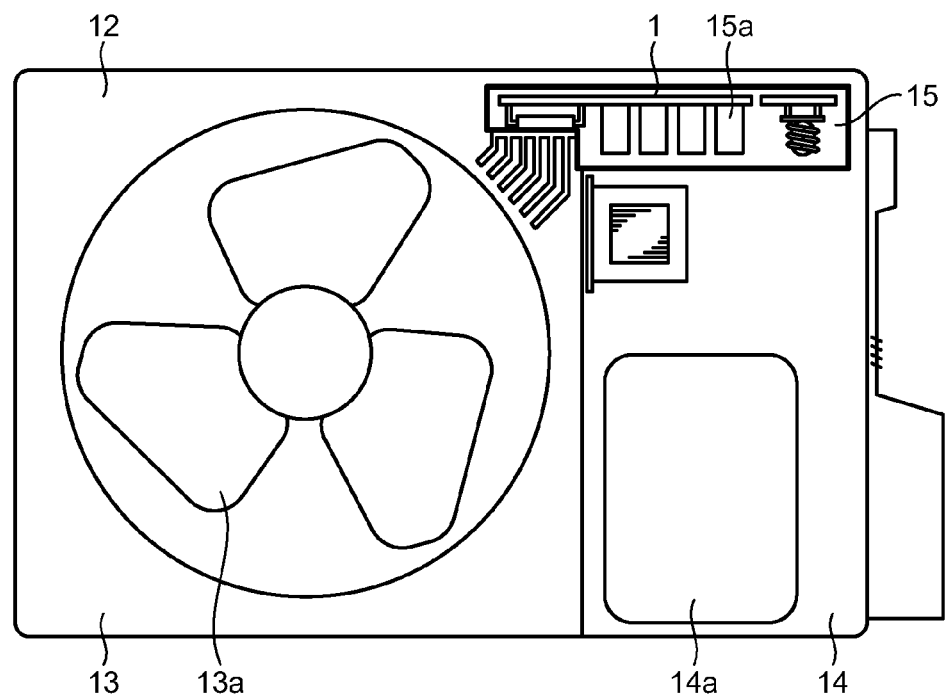

Subsequently, a usage example of the printed wiring board 1 described above is described. FIGS. 5A and 5B are views showing one example of an air conditioner in which the printed wiring board 1 according to the present embodiment is disposed; FIG. 5A is a schematic top view for explaining an outdoor unit, and FIG. 5B is a schematic front view for explaining the outdoor unit. In the illustrated air conditioner, an outdoor unit 12 is composed of a blower chamber 13 that includes a blower 13a, and a compressor chamber 14 that includes a compressor 14a and a flat-shaped electric parts box 15. Within the electric parts box 15, there is provided the printed wiring board 1 on which the quad flat package IC 3 described above is mounted in such a manner that a surface on which electric parts 15a are placed faces downward and a flat-formed rear surface having copper foil faces upward.

Therefore, the electric parts box 15 in which the printed wiring board 1 according to the present embodiment is placed can be structured flat in height, and the electric parts box 15 in the compressor chamber 14 of the outdoor unit 12 of the air conditioner can be flat-shaped so that the installation space therefor is compact to increase flexibility in layout of spaces for other parts, thereby producing an effect that assembly work can be performed leaving a margin. In addition, the air conditioner is equipped with a printed wiring board in which generation of a solder bridge or solder waste that are generated at the time of soldering the quad flat package IC 3 can be prevented, thereby producing an effect of improving the quality of the air conditioner.

As described above, the printed wiring board according to the present embodiment is the printed wiring board 1 that includes the front solder-land groups 5 and the rear solder-land groups 6 to mount the quad flat package IC 3, and has the rear solder-drawing lands 9 on the end side of the rear solder-land groups 6. The rear solder-drawing lands 9 are separated to the right and left (in the horizontal direction with respect to the traveling direction of solder flow) into two parts corresponding to the respective right and left rear solder-land groups 6, and the gap between the right and left rear solder-drawing lands 9 is made narrower in the front portion and wider in the rear portion. Further, the slit 9a that is substantially parallel to the alignment of the rear solder lands 6a of the rear solder-land group 6 frontward adjacent to the rear solder-drawing land 9 is provided therein. Therefore, such an effect is produced that generation of solder bridges and solder waste in the rear solder-land groups 6 can be prevented.

Moreover, because the rear solder-drawing lands 9 are separated to the right and left, collision of solder that has been drawn from the right and left rear solder-land groups 6 is prevented, and such an effect is produced that the solder reversing force toward the rear solder-land groups 6 can be restrained.

Furthermore, because the gap between the right and left separate rear solder-drawing lands 9 is made narrower in the head portion and wider in the rear portion, such an effect is produced that the solder drawing force from the rear solder-land groups 6 is increased and the solder that has been drawn therein can be smoothly flowed toward the rear portions.

Moreover, because a rear land 6b on the rear side is formed longer than the solder lands 6a situated in the front side thereof in the rear solder-land groups 6, such an effect is produced that drawing solder rearward can be facilitated.

Furthermore, because the rear solder-drawing land 9 is formed such that the area of a front portion situated ahead of the slit 9a is made smaller and the area of a rear portion situated behind the slit 9a is made larger than the area of the front portion, such an effect is produced that drawing solder from the front portion to the rear portion is facilitated, and reverse thereof can be restrained.

Moreover, because the joint portions 9d of copper foil that connect the front portion (portion closer to the rear solder-land group 6) ahead of the slit 9a and the rear portion behind the slit 9a are disposed on both end sides of the slit 9a, such an effect is produced that drawing solder into the rear portion from the front portion is facilitated and reverse of solder can be suppressed.

Furthermore, because the quad flat package IC 3 is inclined with respect to the traveling direction of solder flow over the jet solder bath during soldering operation, such an effect is produced that soldering work is facilitated.

Furthermore, because the quad flat package IC 3 uses lead-free solder for the soldering, such an effect is produced that an ecologically friendly printed wiring board can be obtained.

Moreover, the method of soldering a quad flat package IC according to the present embodiment is a method of soldering the quad flat package IC 3 onto the printed wiring board 1 having the front solder-land groups 5 and rear solder-land groups 6 used for placing the quad flat package IC 3, and the printed wiring board 1 has the side solder-drawing lands 7 in positions where the front solder-land groups 5 and the rear solder-land groups 6 are adjacent to each other, and the rear solder-drawing lands 9 on the end side of the rear solder-land groups 6. The rear solder-drawing lands 9 are separated to the right and left into two parts corresponding to the respective right and left rear solder-land groups 6, and the gap between the respective rear solder-drawing lands 9 is made narrower in the front portion thereof and wider in the rear portion thereof. Further, the rear solder-drawing lands 9 are line symmetric (mirror symmetric) to each other, and each of which has the slit 9*a* that is substantially parallel to the alignment of the solder lands (longitudinal direction of the solder lands) of the rear solder-land group 6 adjacent to the drawing lands 9, in a frontward position. The method includes: a mounting process in which the quad flat package IC 3 is mounted on the printed wiring board 1 having the rear solder-drawing lands 9; a flux applying process in which flux activator is applied to the printed wiring board 1 on which the quad flat package IC 3 has been mounted; a preheating process in which this flux activator is heated to the activation temperature; a first solder jetting process in which the leads 4 of the quad flat package IC 3 on the printed wiring board 1 are soldered; and a second solder jetting process in which the solder that has bridged between the leads 4 of the quad flat package IC 3 in the first solder jetting process is removed by the two separate, rear solder-drawing lands 9 and having the slits 9*a*. Therefore, the surface and interfacial tensions of solder that has once been drawn into the rear solder-drawing lands 9 are made to be dispersed to decrease the force of reversing the solder back to the rear solder-land groups 6. As a result, such an effect is produced that solder bridges in the rear solder-land groups 6 are significantly reduced so that the work efficiency can be improved without increasing the manual repair work in a later process.

Moreover, in the soldering method for a quad flat package IC described above, because the quad flat package IC 3 is conveyed in the traveling direction of solder flow over the jet solder bath during soldering, and the front solder-land groups 5 and the rear solder-land groups 6 are inclined with respect to the traveling direction of solder flow, such an effect is produced that soldering work is easy.

Furthermore, because in the air conditioner of the present embodiment, the electric parts box 15 that houses the printed wiring board 1 which has the front solder-land groups 5 and rear solder-land groups 6 used for placing the quad flat package IC 3, and in which the rear solder-drawing lands 9 are provided on the end side of the rear solder-land groups 6, and the rear solder-drawing lands 9 are separated to the right and left into two parts corresponding to the respective right and left rear solder-land groups 6, are formed such that the front portions are smaller and the rear portions are larger, and have the slits 9*a* substantially parallel to the alignment of the solder lands of the rear solder-land group 6 frontward adjacent to the rear solder-drawing lands 9, is disposed above the compressor 14*a* in the compressor chamber 14, such effects are produced that the quality of the air conditioner can be improved with the printed wiring board 1 in which generation of solder bridges in the rear solder-land groups 6 can be prevented, and that the electric parts box 15 of the compressor chamber 14 of the outdoor unit 12 of the air conditioner can be formed in a flat shape so that the installation space of the electric parts box 15 is compact, to increase flexibility in layout of spaces for other parts, and assembly work can be performed leaving a margin.

According to a printed wiring board of the present invention, there are provided rear solder-drawing lands behind a rear solder-land group used for placing a quad flat package IC, wherein the rear solder-drawing lands have front edges each of which is substantially parallel to a longitudinal direction of solder lands of a solder-land group adjacent thereto and has a length approximately equal to or longer than that of the solder lands in the longitudinal direction, are separated into two parts in a horizontal direction with respect to a traveling direction of solder flow such that a gap between the respective separate lands is made wider in its rearward portion than that in its frontward portion, and have a slit substantially parallel to the longitudinal direction near the front edge, thereby producing such effects that it is possible to prevent generation of solder shorts and solder waste between leads of the quad flat package IC under easier management than in the conventional art.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A printed wiring board that has a solder land group used for placing a quad flat package integrated circuit (IC), the solder land group including front solder-land groups and rear solder-land groups, comprising:
   rear solder-drawing lands that are positioned adjacent to the rear solder-land groups, that have front edges each of which is substantially parallel to a longitudinal direction of solder lands constituting the rear solder-land group and has a length approximately equal to or longer than that of the solder lands in the longitudinal direction, that are completely separated into two parts in a horizontal direction with respect to a traveling direction of solder flow such that a gap between the respective separate rear solder-drawing lands is made wider in a rearward portion between the rear solder-drawing lands than in a frontward portion between the rear solder-drawing lands that is positioned forward in the traveling direction, and that have a slit substantially parallel to the longitudinal direction near the front edge, wherein the gap between the two separate rear solder-drawing lands from a front end to a predetermined point has a first constant width, and the gap between the two separate rear solder-drawing lands in a rearward portion relative to the predetermined point has a second constant width wider than the first constant width.

2. The printed wiring board according to claim 1, wherein among the solder lands constituting the rear solder-land group, a solder land on a rear side is formed longer than the solder lands that are positioned frontward thereof.

3. The printed wiring board according to claim 1, wherein the two separate rear solder-drawing lands are line symmetric to each other.

4. The printed wiring board according to claim 1, wherein each separate rear solder-drawing land is formed such that an area of a front portion positioned ahead of the slit is smaller than an area of a rear portion positioned behind the slit.

5. The printed wiring board according to claim 1, wherein each separate rear solder-drawing land has copper foil joint portions that connect the front portion positioned ahead of the slit and the rear portion positioned behind the slit on both end sides of the slit.

6. The printed wiring board according claim 1, wherein the solder-land group used for placing the quad flat package IC is arranged to be inclined with respect to the traveling direction.

7. The printed wiring board according to claim 1, wherein each component is mounted thereon with lead-free solder.

8. The printed wiring board according to claim 1, wherein the maximum width of the rearward portion of each rear solder-drawing land in a direction orthogonal to the traveling direction is less than the maximum width in a direction orthogonal to the traveling direction of the frontward portion having the slit.

9. The printed wiring board according to claim 1, wherein the extent of the outermost edge of the rearward portion of each rear solder-drawing land in a direction orthogonal to the travelling direction is less than the extent of the outermost edge of the frontward portion of each rear solder-drawing land in a direction orthogonal to the traveling direction.

10. A method of soldering a quad flat package IC to a printed wiring board that has a solder-land group for placing a quad flat package IC, the solder-land group consisting of front solder-land groups and rear solder-land groups, the printed wiring board comprising rear solder-drawing lands that are positioned adjacent to the rear solder-land groups, that have front edges each of which is substantially parallel to a longitudinal direction of solder lands constituting the rear solder-land group and has a length approximately equal to or longer than that of the solder lands in the longitudinal direction, that are completely separated into two parts in a horizontal direction with respect to a traveling direction of solder flow such that a gap between the respective separate rear solder-drawing lands is made wider in a rearward portion between the rear solder-drawing lands than in a frontward portion between the rear solder-drawing lands that is positioned forward in the traveling direction, and that have a slit substantially parallel to the longitudinal direction near the front edge, wherein the gap between the two separate rear solder-drawing lands from a front end to a predetermined point has a first constant width, and the gap between the two separate rear solder-drawing lands in a rearward portion relative to the predetermined point has a second constant width wider than the first constant width, the method comprising:
 a mounting step of mounting a quad flat package IC to the printed wiring board;
 a flux application step of applying flux activator to the printed wiring board on which the quad flat package IC has been mounted;
 a preheat step of heating the flux activator that has applied to the printed wiring board to an activation temperature;
 a primary solder jetting step of soldering lead portions of the quad flat package IC on the printed wiring board by a jet soldering equipment; and
 a secondary solder jetting step of removing the solder that has bridged between leads of the quad flat package IC in the primary solder jetting step, by the rear solder-drawing land having the slit.

11. The method of soldering a quad flat package IC according to claim 10, wherein
 the quad flat package IC is conveyed in a traveling direction of solder flow over a jet solder bath during soldering, and
 the front solder-land groups and the rear solder-land groups are arranged to be inclined with respect to the traveling direction of solder flow.

12. An air conditioner, wherein
 an electric parts box in which a printed wiring board is housed is placed above a compressor in a compressor chamber, the printed wiring board having a solder land group used for placing a quad flat package integrated circuit (IC), the solder land group including front solder-land groups and rear solder-land groups, wherein the printed wiring board comprises rear solder-drawing lands that are positioned adjacent to the rear solder-land groups, that have front edges each of which is substantially parallel to a longitudinal direction of solder lands constituting the rear solder-land group and has a length approximately equal to or longer than that of the solder lands in the longitudinal direction, that are completely separated into two parts in a horizontal direction with respect to a traveling direction of solder flow such that a gap between the respective separate rear solder-drawing lands is made wider in a rearward portion between the rear solder-drawing lands than in a frontward portion between the rear solder-drawing lands that is positioned forward in the traveling direction, and that have a slit substantially parallel to the longitudinal direction near the front edge, wherein the gap between the two separate rear solder-drawing lands from a front end to a predetermined point has a first constant width, and the gap between the two separate rear solder-drawing lands in a rearward portion relative to the predetermined point has a second constant width wider than the first constant width.

* * * * *